United States Patent [19]

Hayashi et al.

[11] Patent Number: 5,376,809
[45] Date of Patent: Dec. 27, 1994

[54] SURGE PROTECTION DEVICE

[75] Inventors: Yutaka Hayashi, Tsukuba; Masaaki Sato, Machida; Yoshiki Maeyashiki, Chofu, all of Japan

[73] Assignees: Agency of Industrial Science & Technology, Ministry of International Trade & Industry; Sankosha Corporation; Ome Cosmos Electric Co., Ltd., all of Tokyo, Japan

[21] Appl. No.: 192,305

[22] Filed: Feb. 4, 1994

Related U.S. Application Data

[63] Continuation of Ser. No. 799,200, Nov. 27, 1991, abandoned.

[30] Foreign Application Priority Data

Nov. 28, 1990 [JP] Japan ................. 2-323056

[51] Int. Cl.⁵ .............. H01L 29/74; H01L 29/90; H01L 29/48
[52] U.S. Cl. .................................. 257/173
[58] Field of Search .............. 257/110, 164, 167, 173, 257/603, 471, 473, 476, 483, 484, 174, 479

[56] References Cited

U.S. PATENT DOCUMENTS 4,063,277 12/1977 Gooen .
5,083,185 1/1992 Hayashi et al. .
5,101,244 3/1992 Mori et al. .......................... 257/260

FOREIGN PATENT DOCUMENTS 0259501 11/1986 Japan ........................... 257/164

Primary Examiner—Robert P. Limanek
Assistant Examiner—David B. Hardy
Attorney, Agent, or Firm—Oblon, Spivak, McClelland, Maier & Neustadt

[57] ABSTRACT

A surge protection device for absorbing surges of either polarity has a second region forming a first pn junction with a first region, a third region capable of injecting first minority carriers into the second region, a fourth region forming a second pn junction with the first region and a fifth region capable of injecting second minority carriers into the fourth region. The surfaces of the fourth region and the fifth region and a first Schottky junction with respect to the first region are in mutual electrical connection with a first ohmic electrode, while the surfaces of the second region and the third region and a second Schottky junction with respect to the first region are in mutual electrical connection with a second ohmic electrode. During the initial stage when a surge voltage applied across the first and second electrodes is in a transient rising state, the dV/dt immunity is increased by majority carrier current flowing into the first region through the Schottky junction forward biased owing to the surge polarity and charging the junction capacitance of the reverse biased pn junction.

25 Claims, 7 Drawing Sheets

SURGE PROTECTION DEVICE

This application is a continuation of application Ser. No. 07/799,200, filed on Nov. 27, 1991, now abandoned.

BACKGROUND OF THE INVENTION

1. Field of the Invention

This invention relates to a surge protection device for protecting electric and electronic circuits from abnormally high voltages and currents caused by, for example, lightning, switching surges or the two-terminal like.

2. Description of the Prior Art

A wide range of devices referred to as surge protection devices have been devised. Even the number of such devices that fall in the category of two-terminal surge protectors is considerable. The better of these are not limited to the function of clamping the voltage across the device terminals at a fixed breakdown voltage at the time of breakdown caused by occurrence of a surge (i.e. do not function simply as constant-voltage diodes). Instead they further exhibit negative characteristics when the device current that begins to flow at the time of the device breakdown increases to above the breakover current value. As a result, the voltage across the terminals after breakdown is shifted to a clamp voltage that is lower than the breakdown voltage. It therefore becomes possible to absorb large currents.

Among the surge protection devices of this type some utilize an avalanche or Zenner breakdown mechanism, while others use the punch-through breakdown mechanism. The inventor previously developed a number of improvements in the punch-through type surge protection device. These are described in detail in Japanese Patent Application Public Disclosure Nos. Sho 61-237374, 61-259501, 62-65383 and 62-154776 and Japanese Patent Application Publication No. Hei 1-33951.

FIGS. 9($a$) and 9($b$) show examples of the sectional structure of surge protection devices according to the prior art.

Each of these surge protection devices, designated by reference numeral 10, has a first semiconductor region 1 which is of either p or n conductivity type (n in the illustrated example) and is capable of serving as a semiconductor substrate. A second semiconductor region 2 and a third semiconductor region 3 are successively formed on one principal surface of the semiconductor region 1 by double diffusion. The surge protection device 10 shown in FIG. 9($a$) has a fourth semiconductor region 4 formed on the principal surface of the semiconductor region 1 opposite from that on which the second semiconductor region 2 and third semiconductor region 3 are formed, while the surge protection device 10 shown in FIG. 9($b$) has a fourth semiconductor region 4 which is formed on the same principal surface of the semiconductor region 1 as that on which the second semiconductor region 2 and third semiconductor region 3 are formed but is formed at a position appropriately offset laterally from the regions 2 and 3. In the following explanation, the surface formed with the second semiconductor region 2 and third semiconductor region 3 will be referred to as the "front surface" and the surface opposite thereto as the "back surface". Moreover, the various semiconductor regions will be referred to simply as "regions."

Structurally speaking the surge protection device 10 shown in FIG. 9($a$) is formed with the regions 1, 2, 3 and 4 stacked vertically in the thickness direction of the region 1. Moreover, as will be clear from the explanation of the device's operation given later, the device current resulting from surge absorption flows mainly in the thickness direction of the first region, between the third and fourth regions. The device can therefore be said to be of the vertical type. In contrast, in the surge protection device shown in FIG. 9($b$), the fourth region 4 is situated on the front surface at a position offset laterally from the second and third regions 2, 3. Since the device current during operation also flows laterally, this device can be said to be of the lateral type.

In either type of device, the second region 2 and fourth region 4 have to be of opposite conductivity type from the first region 1 so that each makes a pn junction therewith. Therefore, as shown in the figures, in the case where the first region 1 is of n conductivity type, the second region 2 and the fourth region 4 are of p conductivity type. In a case where punch-through utilized as the initial breakdown phenomenon in the manner to be explained later, however, it is preferable to constitute the second region 2 to be of somewhat low concentration p conductivity type, namely to be of p$^-$ type.

On the other hand, the third region 3 and the first region 1 have to be of the same conductivity type as each other and of opposite polarity type from the second region 2 so as to form carrier injection junctions for injecting minority carriers into the second region. Since, as will be explained later, the third region 3 constitutes one end of the main device current path after breakdown, it preferably has high conductivity (i.e. is preferably of n$^+$ type).

At the surface of the fourth region 4 and the surface region 11 of the semiconductor region 1 to the side of the fourth region 4 is provided a first device terminal T$_1$ (the lower side terminal in the figure) which is in ohmic contact with both of the regions 4 and 11. In addition, a second device terminal T$_2$ is provided in ohmic contact with the surfaces of the second region 2 and the third region 3.

For explaining the most basic operation of the surge protection device 10 during surge absorption it will first be assumed that the device terminal T$_1$ is in ohmic contact only with the surface of the fourth region 4.

When a surge voltage arises across the first and second device terminals T$_1$, T$_2$ at a relatively large magnitude and in such phase as to apply a reverse bias across the pn junction between the first region 1 and the second region 2, the depletion layer produced at the pn junction between the first and second regions by the application of the reverse bias grows not only inwardly into the first region 1 but also toward the third region 3. When the upper extremity of this depletion layer reaches the third region 3, a punch-through state is established between the first region 1 and the third region 3.

When this happens, minority carriers (from the viewpoint of the first region 1) are injected into the first region 1 from the fourth region 4. Since the injected minority carriers collect in the second region 2, device current begins to flow. The voltage at which this punch-through operation starts is designated as breakdown voltage V$_{BR}$ in the operating characteristics of these surge protection devices shown in FIG. 10. On the other hand, even if the second region 2 and the third region 3 should be shorted at their surfaces by mutual connection with the second device terminal T$_2$, once the device current begins to flow via the second region 2, as indicated in FIG. 10 by the portion of the characteristic curve designated as a, where the curve rises rapidly in the direction of the current axis, and rises to the point that the product between itself and the resistance along the path thereof in the second region 2 becomes equal to the forward voltage at the pn junction formed between the second region 2 and the third region 3, the pn junction turns on so that minority carriers (from the viewpoint of the second region 2) are injected from the third region 3 into the second region. This injection of minority carriers into the second region 2 causes the device current flowing between the first and second device terminals $T_1$, $T_2$ to become even larger. Since this in turn promotes the injection of minority carriers from the fourth region 4 into the first region 1, a positive feedback is obtained.

Thus, as can be seen from the voltage vs current characteristic curve in FIG. 10, when the current flowing between the first and second device terminals $T_1$, $T_2$ becomes greater than the value indicated as the breakover current $I_{BO}$, the positive feedback within the device clearly manifests itself in the form of the negative resistance characteristic segment b of the characteristic curve. As a result, the voltage across the first and second terminals $T_1$, $T_2$ shifts to a clamp voltage (or ON voltage) that is lower than the breakover voltage $V_{BO}$ at which breakover commenced and also lower than the breakdown voltage $V_{BR}$ at which punch-through first started. Therefore, as shown by the segment of the characteristic curve marked c, the device is able to absorb large surge currents while holding down the amount of heat it generates.

The maximum current which the surge protection device 10 can absorb across its first and second terminals $T_1$, $T_2$ is generally referred to as its "surge absorption capacity" $I_{PP}$. On the other hand, the minimum device current capable of maintaining the device in its on state after it has once turned on is called its "hold current" $I_H$. Differently from the breakover type surge protection device, in the case of, for example, the simple constant-voltage diode type surge protection device, the voltage across the terminals does not fall even after breakdown but, to the contrary, tends to rise gradually with increasing current absorption. Because of this, the device power consumption, i.e. the voltage across the terminals multiplied by the device current, and in consequence the amount of heat generated by the device become considerably large. The superiority of breakover type devices is obvious from this alone.

While the basic operation is as described in the foregoing, the following additional function is realized as a result of the fact that the first device terminal $T_1$ is in ohmic contact with not only the surface of the fourth semiconductor region 4 but also the surface region 11 of the semiconductor region 1 located to the side of the fourth semiconductor region 4.

As explained earlier, in each of the surge protection devices shown in FIGS. 9(a) and 9(b), the first region 1 and the second region 2 form a pn junction that is reverse biased during occurrence of a surge. A capacitance $C_j$ can therefore be assumed to be present at this junction.

Presuming that the first terminal $T_1$ is not in contact with the first region 1, the occurrence of a surge with a through-rate of dV/dt across the first and second device terminals $T_1$, $T_2$ would lead to the flow of a displacement current $i_t$ as expressed by Eq. 1 for charging the junction capacitance $C_j$.

$$i_t = (dV/dt)C_j \qquad 1)$$

When the areas of the respective regions are increased for obtaining a large surge absorption capacity, the junction capacity $C_j$ also generally becomes large, a value of, say, 100 pF or larger not being unusual. On the other hand, extensive in-depth studies and research conducted up to now have provided detailed information about the characteristics and behavior of surges. It is thus known that a lightning-induced surge on a telephone line, for example, may well result in a through-rate (dV/dt) of as high as around 100 V/μs even in cases where the peak induced noise voltage in the circuit is low.

By substituting this value into Eq. 1, it is clear that the value $i_t$ of the displacement current for charging the junction capacitance may reach around 10 mA. Moreover, since it increases in proportion to the through-rate, it can be seen that the displacement current $i_t$ can reach quite a high instantaneous value.

Thus the device breaks over under a surge whose Desk voltage does not reach the breakover voltage $V_{BO}$ prescribed by the device design, namely under a noise that would not ordinarily need to be absorbed, simply because the noise happened to be a particularly sharp one with a very high dV/dt. (Such a surge will hereinafter be referred to as a "small surge.") What this means in terms of the characteristic curve of FIG. 10 is that the effective breakover voltage $V_{BO}$ at the time such a misoperation occurs is shifted to a smaller value than that indicated by the curve.

In contrast to the foregoing, when the first device terminal $T_1$ is also in ohmic contact with the surface region 11 of the semiconductor region 1 near the fourth semiconductor region 4, a surge of a polarity which reverse biases the first region 1 and the second region 2 is applied. Therefore, the junction between the first region 1 and the fourth region 4 is forward biased. In this state, in the early phase of the surge voltage rise before the forward biased junction turns on, majority carrier current (i.e., an electric current by majority carriers in the first region 1) begins to flow into the first region 1 from the terminal $T_1$ side. As a result, the junction capacitance $C_j$ of the pn junction formed between the first region 1 and the second region 2 is rapidly charged. This technique has in fact been employed for realizing a surge protection device which does not respond to small surges. Moreover, the initial flow of majority carrier current into the first region 1 for charging the junction capacitance proceeds without adversely affecting the aforesaid basic operation occurring after the start of breakdown. The reason for this is that when the increase in the majority carrier current following punch-through of the first region 1 and the third region 3 causes the voltage drop on the majority carrier current path along the fourth region 4 in the first region 1 to become equal to the forward voltage across the junction between the fourth region 4 and the first region minority carriers (from the viewpoint of the first region 1) begin to flow into the first region 1 from the fourth region 4 so that, from this time on, the device makes the transition from breakdown to breakover in accordance with the mechanism described earlier.

While the foregoing explanation was made with respect to a conventional punch-through type device, the inventor has also found that by increasing the thickness of the second region 2 and, in addition, appropriately selecting the geometric, impurity concentration and other parameters of the respective regions, it is possible to fabricate a surge protection device which uses avalanche breakdown or Zenner breakdown as the initial breakdown mechanism for realizing a turn-on operating mechanism which is similar to that of the aforesaid punch-through type device as far as breakover is concerned.

As will be understood from the foregoing, the provision of the device terminal $T_1$ in ohmic contact with not only the fourth region 4 but also the surface of the first region 1 has enabled conventional surge protection devices to achieve a certain degree of freedom from misoperation under exposure to small surges. The problem is, however, that a surge protection device 10 fabricated in this manner is unable to provide an adequately large reverse withstand voltage. This is because the first region 1 is in direct contact with the device terminal $T_1$ via the ohmic contact portion 11 in a state where the first region 1 and the second region 2 are in a forward biased relationship and, therefore, the device terminals $T_1$, $T_2$ are in essence simply connected through a forward biased diode. The reverse direction characteristics of the device are therefore as indicated by the curve d in FIG. 10.

The conventional technology is therefore incapable of enabling fabrication of a surge protection device that is able to absorb surge irrespective of whether the positive surge polarity appears on the first device terminal $T_1$ or on the second device terminal $T_2$. If the first terminal $T_1$ should not have the portion 11 in ohmic contact with the first region 1, it would be possible to absorb surge of either polarity by forming the fourth region 4 in the same manner as the second region 2 and forming a fifth region in the fourth region 4 in the same manner as the third region 3 is formed in the second region 2. In this case, at the occurrence of a reverse polarity surge (i.e. a surge of the polarity causing the second device terminal $T_2$ to become positive), the pn junction at which punch-through (a avalanche or Zenner breakdown) occurs would be the second pn junction formed by the first region 1 and the fourth region 4 and the function previously played by the third region 3 would be taken over by the fifth region. The negative characteristics obtained with this arrangement would thus enable absorption of reverse polarity surges.

If, however, a second device terminal $T_2$ should be provided in ohmic contact with both the surface of the second region 2 and the surface of the first region 1 for charging the junction capacitance of the second pn junction between the second region 2 and the first region 1, just as the first device terminal $T_1$ was provided in ohmic contact with both the surface of the fourth region 4 and the surface of the first region 1 for charging the junction capacity of the pn junction between the second region 2 and the first region 1, the first and second device terminals $T_1$, $T_2$ would be shorted through their portions in ohmic contact with the first region 1, making the presence of the second to fifth regions totally meaningless.

An object of the present invention is to provide a surge protection device of the two-terminal breakover type that is capable of absorbing surges irrespective of the polarity thereof, and which is capable of preventing misoperation under exposure of the device to a small surge.

Another object of the invention is to provide a surge protection device enabling highly precise control of the breakover current $\pm I_{BO}$ preferably within increased design freedom and hold current $\pm I_H$. This object of the invention also contributes to keeping the device from responding to a surge which is small in terms of energy but nevertheless exhibits a large dV/dt. In other words, while increasing the breakover current $I_{BO}$ has the effect of increasing the device's immunity to small surges, to take advantage of this effect it is first necessary to ensure highly stable realization of a breakover current $I_{BO}$ and a hold current $I_H$ that are as near the design values as possible.

Another object of the invention is to provide a surge protection device exhibiting a large surge absorption capacity.

SUMMARY OF THE INVENTION

This invention provides a two-terminal surge protection device for absorbing surges of either polarity, comprising:

a) a first region formed of a semiconductor of one conductivity type, b) a second region formed of a semiconductor of opposite conductivity type from the semiconductor of the first region and forming a first pn junction with the first region, c) a third region formed of a semiconductor of said one conductivity type and contacting the side of the second region opposite from that in contact with the first region, the third region forming with the second region a first minority carrier injection junction capable of injecting into the second region carriers that are minority carriers to the second region, d) a fourth region formed of a semiconductor of said opposite conductivity type and forming a second pn junction with the first region, e) a fifth region formed of a semiconductor of said one conductivity type and contacting the side of the fourth region opposite from that in contact with the first region, the fifth region forming with the fourth region a second minority carrier injection junction capable of injecting into the fourth region carriers that are minority carriers to the fourth region, f) a first ohmic electrode disposed to electrically short the surface of the fourth region and the surface of the fifth region, g) a second ohmic electrode disposed to electrically short the surface of the second region and the surface of the third region, h) a first Schottky junction formed by contacting a first Schottky metal with the first semiconductor region and, when forward biased, operated by carriers that are majority carriers to the first semiconductor region to allow majority carrier current to flow through the first Schottky junction for charging a junction capacitance of the first pn junction, the junction capacitance of the first pn junction being formed upon application of a reverse bias to the first pn junction, the first Schottky metal being in electrical contact with the first ohmic electrode and i) a second Schottky junction formed by contacting a second Schottky metal with the first semiconductor region and, when forward biased, operated by carriers that are majority carriers in the first semiconductor region to allow majority carrier current to flow through the second Schottky junction for charging a junction capacitance of the second pn junction, the junction capacitance of the second pn junction being formed upon application of a reverse bias to the second pn junction, the second Schottky metal being in electrical contact with the second ohmic electrode.

This arrangement provides a two-terminal, breakover type surge protection device capable of preventing undesired response to small surges and of absorbing surges of either polarity.

The invention also provides a two-terminal, breakover type surge protection device capable of absorbing surges of either polarity which has a vertical structure in which the ratio between of the area of the fourth region and the area of the first Schottky junction and the ratio between the area of the second region and the area of the second Schottky junction are established so as to obtain the required surge absorption capacity for each polarity. The device according to the invention can therefore also be designed to obtain increased surge absorption capacity.

In accordance with another of its features the invention provides a two-terminal, breakover type surge protection device capable of absorbing surges of either polarity which has a vertical structure in which the width of the fourth region in the direction in which it extends together with the first Schottky junction and the width of the second region in the direction in which it extends together with the second Schottky junction are prescribed so as to obtain the required breakover current or hold current. This arrangement enables the breakover current and hold current to be controlled by controlling the width of the fourth and second regions.

In accordance with another of its features, the invention provides a surge protection device capable of absorbing surges of either polarity which has a vertical structure in which the first and second Schottky junctions have plan view configurations all or part of which are formed as rectangles or near rectangles whose widths lie in the direction in which the fourth and second regions extend and further in which the aforesaid widths of the first and second Schottky junctions are not greater than those which, during flow in the first region of carriers that are majority carriers to the first region, enable this current to flow in or out in a substantially converged manner. This makes it possible to control the breakover current and hold current by controlling the widths of the first and second Schottky junctions.

In accordance with another of its features the invention provides a two-terminal, breakover type surge protection device capable of absorbing surges of either polarity which has a vertical structure having at least one pair of fourth and second regions extending in the same direction, the first and second Schottky junction provided therebetween being respectively limited in width to not greater than twice the widths which causes majority carrier current to flow through the first and second Schottky junctions into the first semiconductor region in a substantially converged manner.

In accordance with another of its features the invention provides a two-terminal, breakover type surge protection device capable of absorbing surges of either polarity which has a vertical structure wherein the aforesaid widths of the first and second Schottky junctions are wider than the width which causes majority carrier flow in the first region to flow through the first and second Schottky junctions in a substantially converged manner. This arrangement makes it possible to stabilize the values of the breakover current and the hold current independently of any deviation in the widths of the Schottky junctions occurring during device fabrication.

The above and other features of the present invention will become apparent from the following description made with reference to the drawings.

DESCRIPTION OF THE PREFERRED EMBODIMENTS

Figure 1:
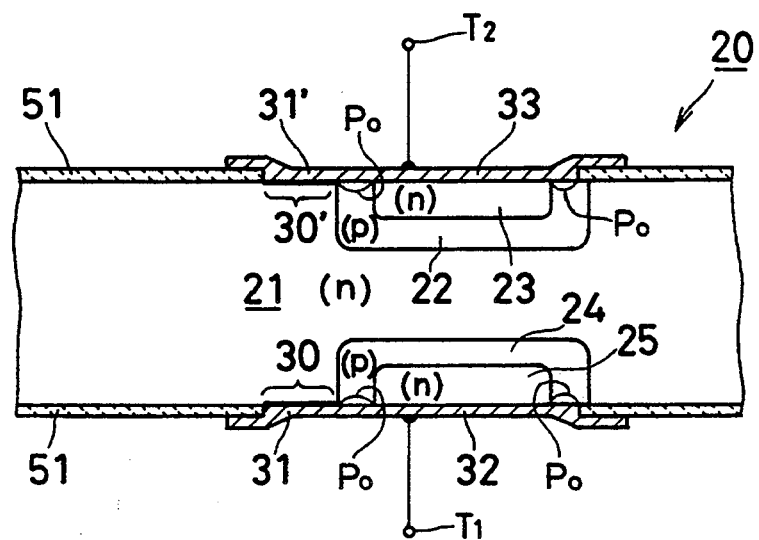
FIG. 1 is a schematic sectional view of an embodiment of a vertically-fabricated, two-terminal, breakover type surge protection device capable of absorbing surges of either polarity according to the invention.

FIG. 1 shows the structure of a vertical type surge protection device 20 according to a first, fundamental embodiment of the invention. Throughout the embodiments illustrated in the drawings, identical reference symbols indicate identical or similar members. Frequently such members will be explained only the first time they are referred to. Insofar as it is not explicitly stated to the contrary, members designated by identical reference symbols and the modifications thereof explained in the specification can be used interchangeably among all of the embodiments.

The device illustrated in FIG. 1 comprises a first semiconductor region 21 which is an n-type semiconductor substrate obtained from a semiconductor wafer. On one principal surface of the first semiconductor region 21 is formed a second semiconductor region 22 of the opposite conductivity type from the first semiconductor region 21. The first semiconductor region 21 and the second semiconductor region 22 form a first pn junction. A third semiconductor region 23 of n conductivity type is formed on the side of the second semiconductor region 22 opposite from that in contact with the first semiconductor region 21.

A fourth p conductivity type semiconductor region 24 is formed on the other principal surface of the first semiconductor region 21, thereby forming a second pn junction. A fifth semiconductor region 25 of n conductivity type is formed on the side of the fourth semiconductor region 24 opposite from that in contact with the first semiconductor region 21. The second semiconductor region 22 and the fourth semiconductor region 24 are physically equivalent regions, as are the third semiconductor region 23 and the fifth semiconductor region 25. These physically equivalent pairs are also preferably geometrically identical. Specifically, it is preferable for them to have the same area and thickness and to be located as opposed to each other across the intervening first semiconductor region 21. Hereinafter, the semiconductor regions 21-25 will be referred to simply as "regions" 21-25.

The surge protection device 20 is characterized by the fact that a first Schottky junction forming member or first Schottky metal 31 extending in the same direction as the fourth region 24 is formed in a prescribed pattern such that its bottom area region substantially forms a first Schottky junction 30 with the first region 21 and that a second Schottky junction forming member or second Schottky metal 31' extending in the same direction as the second region 22 is formed in a prescribed pattern such that its bottom area region substantially forms a second Schottky junction 30' with the first region 21.

Figure 2:
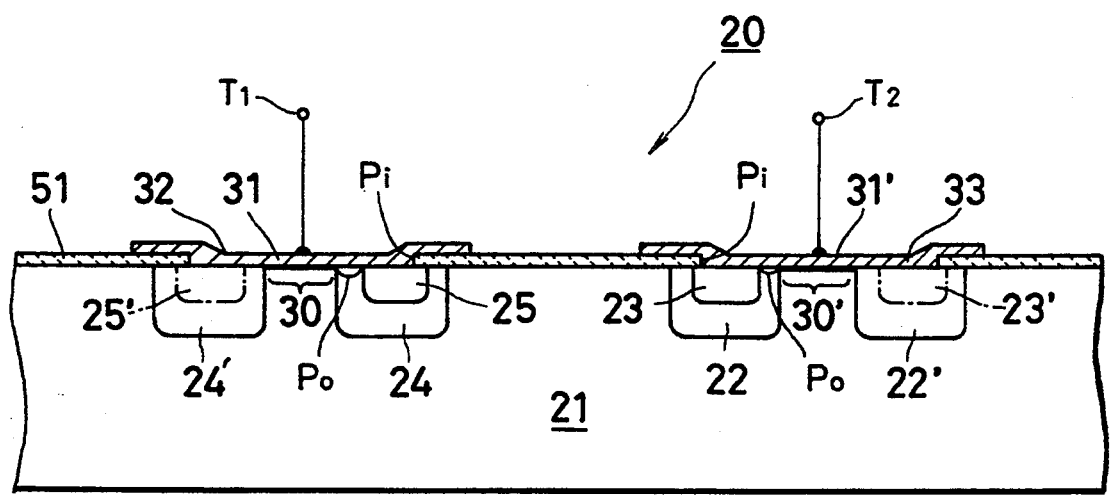
FIG. 2 is a schematic sectional view of an embodiment of a laterally-fabricated, two-terminal, breakover type surge protection device capable of absorbing surges of either polarity according to the invention.

In the case of the lateral structure shown in FIG. 2, on the other hand, the fourth region 24 is on the same principal surface of the first region 21 as the second region 22, at an appropriate position lateral of the second region 22. The third region 23 is formed in contact with the second region 22 and the fifth region 25 in contact with the fourth region 24. In addition, the first Schottky junction forming member or first Schottky metal 31 extending in the same direction as the fourth region 24 is formed in a prescribed pattern such that its bottom area region substantially forms a first Schottky junction 30 with the first region 21 and the second Schottky junction forming member or second Schottky metal 31' extending in the same direction as the second region 22 is formed in a prescribed pattern such that its bottom area region substantially forms a second Schottky junction 30' with the first region 21.

The second pair of second and third regions (22', 23') and the second pair of fourth and fifth regions (24', 25') shown in the embodiment of FIG. 2 will be explained later. Initially the explanation will be made with respect to the device not having the regions designated by the prime reference numerals.

In forming the regions 21, 22, 23, 24, 25 with respect to the first region 21 so as to have the desired conductivity type, thickness and impurity concentration, it is possible, for example, to use the techniques for selective diffusion of boron (p type) or phosphorus (n type) or to adopt an appropriate one from among the numerous other prior art technologies available. Moreover, it is also possible to reverse the conductivity types of all five regions 21, 22, 23, 24, 25. In this case the directions of the operation and device currents merely become the opposite from those explained in the following. Aside from this point, the following explanation also applies substantially as it is to the devices modified in this manner.

The surge protection device 20 is essentially a two-terminal device. One of the two terminals, the first device terminal $T_1$, is in mutual electrical connection with the surface of the fourth region 24, the surface of the fifth region 25 and the first Schottky metal 31, while the other, second device terminal $T_2$, is in mutual electrical connection with the surface of the second region 22, the surface of the third region 23 and second Schottky metal 31'. As can be seen from the first and second embodiments, these electrical connections can be established by providing appropriately patterned first and second ohmic electrodes 32, 33. Moreover, the first and second ohmic electrodes 32, 33 can also be utilized as the first and second Schottky metals 31, 31'.

In the case of the embodiment shown in FIG. 1, the front and back surfaces of the first region 21 are formed with insulation layers 51, 51, while in the case of the embodiment shown in FIG. 2, only the principal surface of the first region provided with the regions 22-25 is formed with an insulation layer 51. In either case, the insulation layer(s) is/are formed in a prescribed pattern having openings for provision of the first and second ohmic electrodes 32, 33. The first ohmic electrode 32, which also serves as the first Schottky metal 31, contacts the surfaces of the fourth region 24 and fifth region 25 and further extends in one sectional direction of the fourth region 24 to form the first Schottky junction with respect to the area region 30 of the first region 21. The second ohmic electrode 33, which also serves as the first Schottky metal 31', contacts the surfaces of the second region 22 and third region 23 and further extends in one sectional direction of the second region 22 to form the second Schottky junction with respect to the area region 30' of the first region 21.

The surge protection devices 20 shown in FIGS. 1 and 2 are both bipolar, two-terminal, breakover type surge protection devices able to absorb surges equally well irrespective of whether the polarity of the surge causes the device terminal $T_1$ or the device terminal $T_2$ to become positive. They are also devices which do not respond to the "small surges" referred to earlier.

In the case where the device is subjected to a surge causing the first device terminal $T_1$ to become positive and the second device terminal $T_2$ to become negative, the second Schottky junction 30' is reverse biased and thus exhibits reverse withstand voltage. With current leakage from the second Schottky junction 30' being prevented in this manner, majority carrier current (i.e., an electric current by majority carriers in the first region 21) flows into the first region 21 through the forward biased first Schottky junction 30 before the pn junction between the first region 21 and the fourth region 24 is turned on by being forward biased (i.e. during the low voltage state in the early phase of the surge voltage rise). As a result, the junction capacity $C_j$ of the pn junction formed between the first region 21 and the second region 22 can be rapidly charged.

Figure 10:
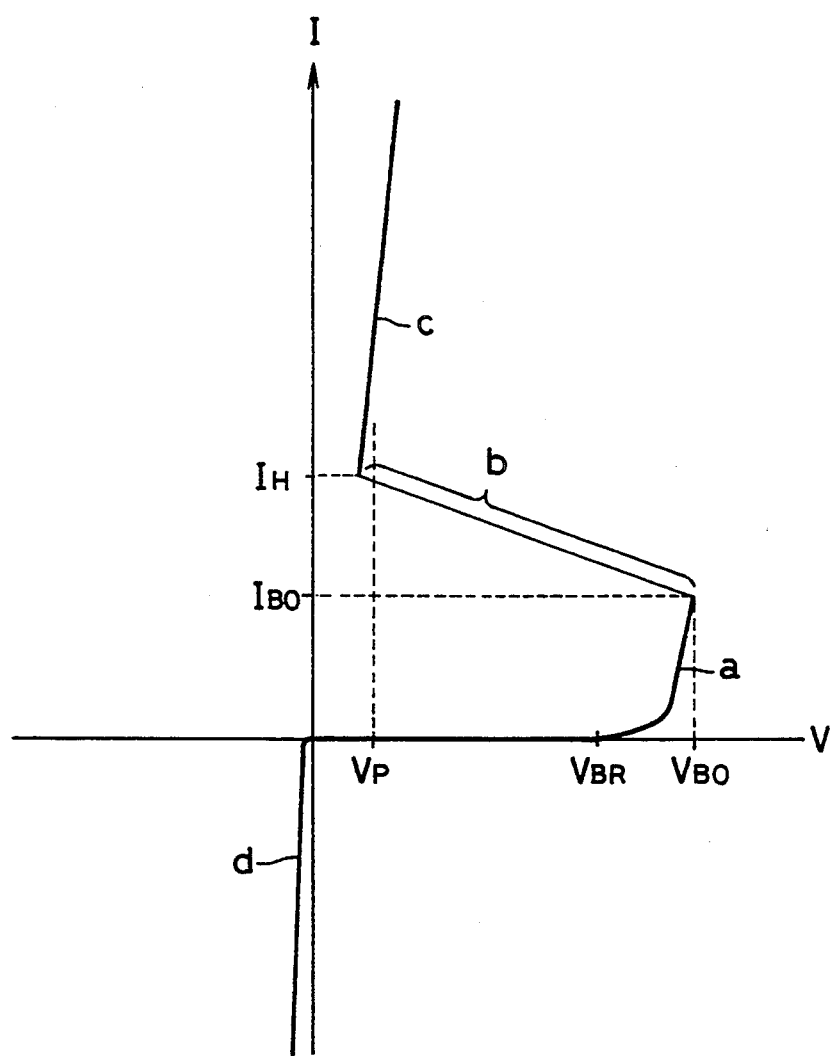
FIG. 10 is a graph showing the surge absorption characteristics of the conventional device of FIG. 9.

On the other hand, since the first device terminal $T_1$ is in direct electrical contact with the fourth region 24 via the first ohmic electrode 32, the condition is operationally equivalent to that in which the fifth region 25 is not present. Therefore, following the aforesaid charging of the junction capacity, a basic surge absorption operation with negative characteristics is realized, in the manner described earlier with respect to the prior art, by dint of punch-through or avalanche breakdown, Zenner breakdown or other such mechanism caused by reverse biasing of the first pn junction between the first region 21 and the second region 22. In the surge protection device 20 according to FIGS. 1 and 2, therefore, the breakover characteristic curve with respect to a surge that causes the first device terminal $T_1$ to become positive is as shown in the first quadrant of FIG. 4. This corresponds to the characteristic curve of the conventional unipolar surge protection device shown in FIG. 10.

On the other hand, when the surge protection device 20 according to the invention is subjected to a surge causing the first device terminal $T_1$ to become negative and the second device terminal $T_2$ to become positive, it again operates in exactly the same manner as explained in the foregoing.

Figure 4:
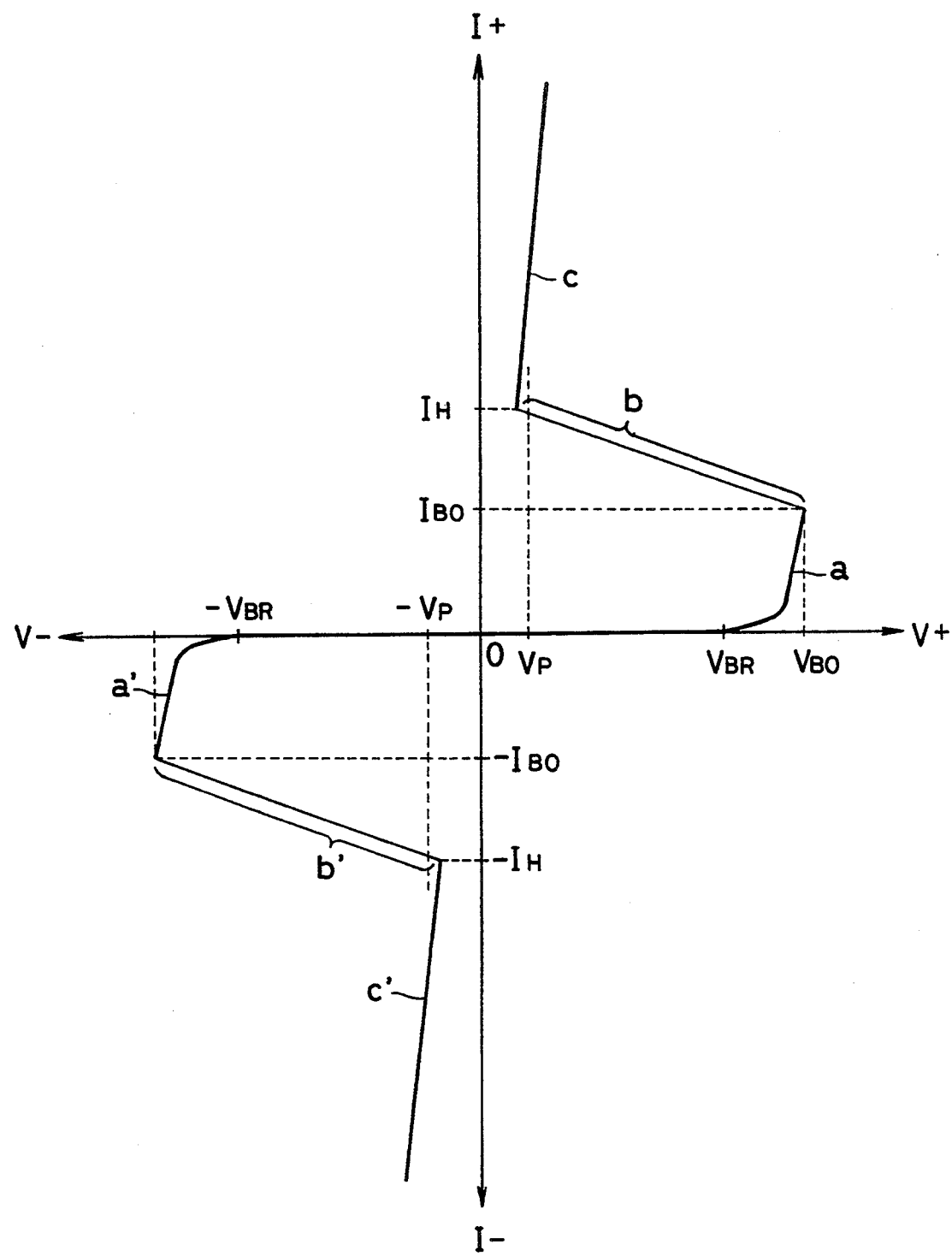
FIG. 4 is a graph showing the voltage vs current characteristics of a two-terminal, breakover type surge protection device capable of absorbing surges of either polarity according to the invention.

More specifically, in such a situation the first Schottky junction 30 is reverse biased and thus exhibits reverse withstand voltage. With current leakage from the first Schottky junction 30 being prevented in this manner, majority carrier current flows into the first region 21 through the forward biased second Schottky junction 30' before the pn junction between the first region 21 and the second region 22 is turned on by being forward biased. As a result, the junction capacity $C_j$ of the second pn junction formed between the first region 21 and the fourth region 24 can be rapidly charged. Moreover, since the second device terminal $T_2$ is in direct electrical contact with the second region 22 via the second ohmic electrode 33, the condition is operationally equivalent to that in which the third region 23 is not present. Therefore, following the aforesaid charging of the junction capacity, a basic surge absorption operation is realized. Namely, in this case the second region 22 performs the function of the fourth region 24 described earlier, while the fifth region 25 performs that of the third region 23 described earlier. In the surge protection device 20 according to FIGS. 1 and 2, therefore, the breakover characteristic curve with respect to a surge that causes the first device terminal $T_1$ to become negative is as shown in the third quadrant of FIG. 4 and, with respect to the origin, is symmetrical to the characteristic curve in the first quadrant. Insofar as the production parameters of the corresponding regions are identical, the breakdown voltage $-V_{BR}$, breakover voltage $-V_{BO}$, breakover current $-I_{BO}$ and hold current $-I_H$ in the third quadrant will be the same in absolute value to the breakdown voltage $V_{BR}$, breakover voltage $V_{BO}$, breakover current $I_{BO}$ and hold current $I_H$ in the first quadrant. This means that the portions a, b and c of the characteristic curve of FIG. 4 correspond to portions a, b and c in FIG. 10, while the portions a', b' and c' of the characteristic curve in FIG. 4 are symmetrical to the portions a, b and c in FIG. 10 with respect to the origin.

Although tending to be lower than that of a silicon diode, the reverse withstand voltage of a Schottky junction can set to be about as high as that of recent discrete Schottky diodes and, therefore, the reverse withstand voltage of the surge protection device 20 can be set at a value higher than the breakdown voltage $V_{BR}$ relating to surge absorption.

The positions of the illustrated regions can be varied considerably. Although in the vertical device shown in 10 FIG. 1, for example, the second region 22 and fourth region 24 are disposed in facing relationship so as to minimize the distance therebetween and thus maximize operating speed and achieve uniform device current, the invention is not limited to this arrangement but also encompasses arrangements in which these regions are laterally offset from one another. In the lateral device shown in FIG. 2 also, the relative positioning among the first Schottky junction 30, the second region 22 and the fourth region 24 can be different from that illustrated.

Figure 3:
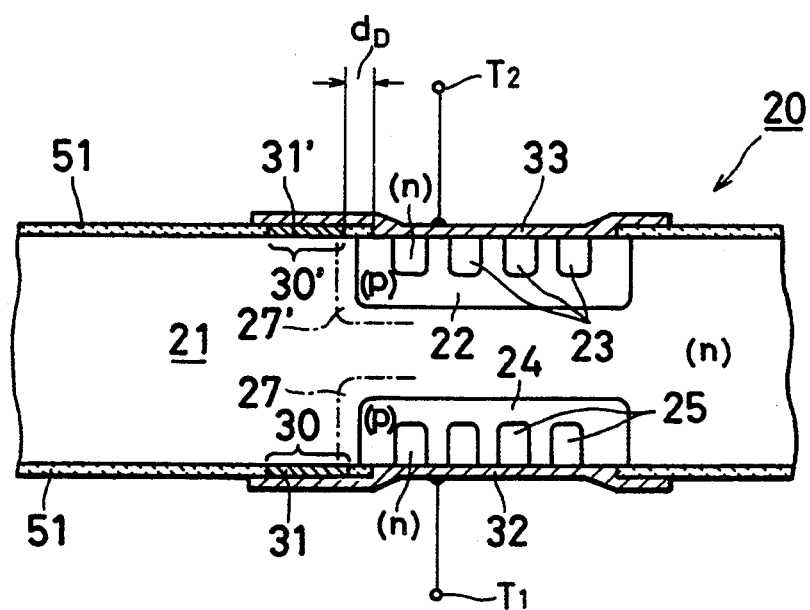
FIG. 3 is a schematic sectional view of a modified embodiment of the vertically fabricated device.

FIG. 3 shows an embodiment in which the first and second Schottky metals 31, 31' are formed of separate material from that of the first and second ohmic electrodes 32, 33 and the first and second ohmic electrodes 32, 33 provided in ohmic contact with the surfaces of the first and second Schottky metals 31, 31'.

While FIG. 3 illustrates a vertically fabricated embodiment of the surge protection device 20 according to the present invention, this embodiment can also be modified to have a lateral structure like that of FIG. 2. In this case, it is possible, in forming the first and second Schottky junctions 30, 30', to choose between an arrangement in which the first and second ohmic electrodes 32, 33 themselves constitute the first Schottky metals 31, 31' and an arrangement in which the first and second Schottky metals 31, 31' and the first and second ohmic electrodes 32, 33 are formed of separate materials and ohmically contacted.

Materials usable for forming the Schottky junctions; with respect to the first region 21 encompass various; conventional ones, among which can be mentioned elemental metals such as Al, Ag, Cu, Cr, Mo, Ni, Pd, W and the like and alloys such as $WSi_2$ and the like. However, the invention is not directly limited to these. The most generally used and inexpensive material is Al, which is also appropriate for use in the case where the ohmic electrode material also serves as the Schottky metal material as in the embodiments of FIGS. 1 and 2. The term "Schottky metal" as used in this specification includes both elemental metals and alloys.

Schottky junctions are, however, susceptible to current leakage at the sides (edges). When an edge of each of the first and second Schottky junctions 30, 30' is directly contacted with an edge of the associated one of the fourth region 24 and second region 22, however, the amount of current leakage can be reduced, whereby controllability of the breakover current $I_{BO}$ and the hold current $I_H$ is enhanced so as to minimize deviation from the values prescribed by the design specifications. Contact between an edge of the fourth region 24 and an edge of the first Schottky junction 30 and between the second region 22 and the second Schottky junction 30' can also be established in the case where the surge protection device 20 according to the invention is laterally fabricated.

Notwithstanding the foregoing, an effect equivalent to that obtained by having one edge of each of the first and second Schottky junctions 30, 30' in direct contact with an edge of the associated one of the fourth region and second region can be realized without establishing such contact if, as indicated by the typical example illustrated in conjunction with FIG. 3, the distance $d_D$ between the opposing edges of the fourth region 24 and the first Schottky junction 30 and the distance $d_D$ between the opposing edges of the second region 22 and the second Schottky junction 30' are respectively smaller than the distances by which the depletion layer 27 formed by the pn junction between the fourth region 24 and the first region 1 and the depletion layer 27' formed by the pn junction between the second region 22 and the first region 21 extend laterally, namely if the edges of the first and second Schottky junctions 30, 30' fall within the ranges to which the depletion layers 27, 27' extend. In other words, the case illustrated in FIG. 1 is a special one in which the distance $d_D$ is zero.

Moreover, if, as shown in the laterally fabricated embodiment of FIG. 2, the second region is formed as at least a pair of sub-regions 22, 22' and the fourth region is formed as a pair of sub-regions 24, 24' and the two pairs are formed as separated from each other at least within a section of the surface region extending in one direction, as shown in the drawing, and, further, if the Schottky junction 30' is formed between the sub-regions 22, 22' and the Schottky junction 30 is formed between the sub-regions 24, 24' and the opposite edges of the Schottky junctions 30, 30' are either formed in contact with the edges of the associated pair of second sub-regions 22, 22' or fourth sub-regions 24, 24' or formed to be positioned within the range to which the associated one of the depletion layers 27, 27' extends as illustrated in FIG. 3, then the leakage current through the Schottky junctions 30, 30' will naturally be reduced to a very low level and, as a result, the stability of the breakover current $I_{BO}$ and the hold current $I_H$ of the surge protection device according to the invention will be improved. It should be noted, however, that with this arrangement is possible, as indicated by phantom lines in the drawing, to eliminate the third sub-region 23' and the fifth sub-region 25'.

As can be inferred from the embodiment shown in FIG. 2, the number of sub-regions of the second and fourth regions is not limited to two and can be increased to three or more with a Schottky junction sub-junction being formed between each adjacent pair sub-regions. In this case, the Schottky junction sub-junctions formed between the adjacent ones of the plurality of sub-regions of the second and fourth regions (the number of which is one less than the number of sub-regions of the fourth region) each preferably has its opposite edges formed either so as to contact the edges of the pair of sub-regions between which it is located or so as to be positioned within the range to which the depletion layer formed between the pair of sub-regions and the first region extends within the principal surface of the first region. It goes without saying that in this case the plurality of fourth region sub-regions and the plurality first Schottky junction 30 sub-junctions are all in mutual electrical connection with the first device terminal $T_1$ and the plurality of second region sub-regions and the plurality of second Schottky junction 30' sub-junctions are all in mutual electrical connection with the second device terminal $T_2$. Moreover, it suffices for the plurality of second and fourth sub-regions to be counted at least within a section of the surface region extending in one direction and, for example, it is permissible for the ends thereof in the direction perpendicular to the aforesaid section to be in connection with each other.

Further, the Schottky junctions 30, 30' can have various planar configurations. While square and rectangular are common configurations, other ordinary shapes that can be used include regular polygons, circles, parallelograms, triangles and the like. In contrast, it is also possible to use a configuration in which a plurality of fourth and second region sub-regions enclose the 10 Schottky junctions 30, 30'. As one example of this latter case, there can be mentioned a pattern in which the fourth region sub-regions and the second region sub-regions are square or rectangular, four (for example) of each are disposed as separated from each other as viewed from above, and the Schottky junctions 30, 30' are disposed in the shape of a cross between the separated sub-regions, and as another there can be mentioned a pattern in which regular polygonal fourth and second region sub-regions are disposed in a honeycomb arrangement with the individual boundary portions between the honeycomb cells being formed by the Schottky junctions 30, 30'.

The embodiment of FIG. 2 is a particularly preferred example of the structure of the surge protection device 20 according to the present invention when it is fabricated laterally. The contact relationship between the ohmic electrode 33 in mutual ohmic contact with the second and third regions 22, 23 and the surfaces of the regions 22, 23 is such that, as regards the contact edge of the ohmic electrode 33, the ohmic electrode 33 does not contact the second region 22 as viewed from the direction of the third region 23 toward the fourth region 24 (as indicated by the symbol $P_i$) and, as viewed in the opposite direction, has a portion which extends beyond the junction boundary between the third region 23 and the second region 22 to make contact with the surface of the second region 22 (as indicated by the symbol $P_o$). In exactly the same manner, the contact relationship between the ohmic electrode 32 in mutual ohmic contact with the fourth and fifth regions 24, 25 and the surfaces of the regions 24, 25 is such that, as regards the contact edge of the ohmic electrode 32, the ohmic electrode 32 does not contact the fourth region 24 as viewed from the direction of the fifth region 25 toward the second region 22 (as indicated by the symbol $P_i$) and, as viewed in the opposite direction, has a portion which extends beyond the junction boundary between the fifth region 25 and the fourth region 24 to make contact with the surface of the fourth region 24 (as indicated by the symbol $P_o$).

As a result, when a surge causing the first device terminal $T_1$ to become positive is larger than a prescribed magnitude so that either the first pn junction between the first region 21 and the second region 22 directly breaks down or punch-through occurs between the first region 21 and the third region 23, the flow of what are minority carriers to the first region 21 (holes in the case of the illustrated conductivity type relationship) into the first region 21 from the fourth region 24 cannot reach the second device terminal $T_2$ unless when passing through the second region 22 it follows a horizontal path through the region under the third region 23. The flow of the minority carriers therefore has relatively uniform distribution. Since this also contributes to the controllability and stability of the breakover current $I_{BO}$ and the hold current $I_H$, it enhances the surge absorption capacity. In exactly the same way, when a surge causing the second device terminal $T_2$ to become positive is larger than a prescribed magnitude so that either the second pn junction between the first region 21 and the fourth region 24 directly breaks down or punch-through occurs between the first region 21 and the fifth region 25, the flow of what are minority carriers to the first region 21 into the first region 21 from the second region 22 cannot reach the first device terminal $T_1$ unless when passing through the fourth region 24 it follows a horizontal path through the region under the fifth region 25. The flow of the minority carriers therefore again has relatively uniform distribution, which contributes to the controllability and stability of the breakover current $-I_{BO}$ and the hold current $-I_H$ and thus enhances the surge absorption capacity.

On the other hand, in the case of FIG. 1 showing an embodiment in which the surge protection device 20 according to the invention is fabricated to have a vertical structure, the ohmic electrode 33 in mutual ohmic contact with the second region 22 and the third region 23 has end portions P₀, P₀ at the opposite sides of the third region 23 which extend onto the surface of the second region 22, and the ohmic electrode 32 in mutual ohmic contact with the fourth region 24 and fifth region 25 has end portions P₀, P₀ at the opposite sides of the fifth region 25 which extend onto the surface of the fourth region 24.

Therefore, the aforesaid minority carriers from the fourth region 24 flow uniformly along the bottom surface of the third region 23 on their way to the second device terminal $T_2$, while the aforesaid minority carriers from the second region 22 flow uniformly along the bottom surface of the fifth region 25 on their way to the first device terminal $T_1$. This also improves the controllability of the breakover current and the hold current and, as such, has the effect of enhancing the surge absorption capacity.

As shown in the embodiment illustrated in FIG. 3, if a plurality of third region 23 sub-regions or a plurality of fifth region 25 sub-regions are provided at least within a section of the surface region extending in one direction, each of the sub-regions will have at either end an ohmic terminal portion in ohmic contact with the second region 22. Since this makes it possible to obtain an even more uniform current distribution, it actually increases the controllability of the breakover current $\pm I_{BO}$ and hold current $\pm I_H$. By and large, the surge absorption capacity increases in proportion to the device area. The sub-regions 23, . . . , and the sub-regions 25, . . . , are of course all preferably of the same width and disposed in parallel at equal intervals (although the ends thereof in the direction perpendicular to that shown may be connected with each other).

The surge protection device 20 according to the invention will now be examined from a different angle with reference to FIGS. 5–8. However, since the explanation to be given here applies regardless of which of the first and second device terminals $T_1$, $T_2$ the surge polarity causes to become positive, the explanation will, in the interest of simplifying the drawings, be made only with respect to a surge of a polarity which causes the first device terminal $T_1$ to become positive and in FIGS. 5 and 7 there will be indicated only the regions which conduct effective operations with respect to surges of this polarity, namely the first region 21, the second region 22, the third region 23, the fourth region 24 and the first Schottky junction 30, while the fifth region 25 formed within the fourth region 24 and the second Schottky junction 30' will be omitted. With respect to surges of the opposite polarity, it suffices to read the explanation with the first and second device terminals interchanged, the fourth region replaced by the second region, the third region by the fifth region, the second region by the fourth region and the first Schottky junction 30 by the second Schottky junction 30'.

In obtaining the sectional structures shown in the drawings for the respective embodiments described in the foregoing, it is generally convenient to provide the fourth region 24 as well as the Schottky junction 30 newly established by this invention so as also to have rectangular shapes in plan view. The symbols assigned to the dimensions of the respective device portions in FIG. 5 assume this to be the case.

Considering first the basic model in which only one fourth region 24 and only one first Schottky junction 30 are in mutual connection with the first device terminal $T_1$, the width of the first Schottky junction 30 in the one in-plane direction (which will be called the x direction here) is defined as $X_S$, the width of the fourth region 24 in the x direction is defined as $X_C$, one edge of the first Schottky junction 30 is assumed to be in contact with the opposing one edge of the fourth region 24, and the sum of the widths of the aforesaid regions ($X_S+X_C$) is defined as effective width $L_E$. On the other hand, the widths of the Schottky junction and the fourth region in the y direction perpendicular to the illustrated section are defined as W, the thickness of the first Schottky junction 30 is assumed to be substantially zero, the thickness of the fourth region 24 is defined as $h_C$, and the resistivity of the first region (i.e. the semiconductor substrate) is defined as $\rho$.

If the forward bias voltage drop of the first Schottky junction 30 is defined as $V_{sf}$ (known normally to be about 0.1–0.3 V) and the voltage drop required for forward biasing the pn junction formed between the fourth region 24 and the first region 21 as $V_f$ (known normally to be about 0.5–0.6 V), then, in view of the aforesaid operation of the surge protection device 20 according to the invention, the magnitude of the current initially flowing through the first Schottky junction 30 gradually increases, finally reaching the current value $I_{sf}$ required for turning on the pn junction including the fourth region 24. The current value $I_{sf}$ can in principle be expressed as $$I_{sf} \approx (V_f - V_{sf}) \cdot x_S \cdot W / h_C \rho \qquad 2)$$

For the reason explained earlier, this can also be said to apply to the case where a plurality of fourth region 24 sub-regions or of first Schottky junction 30 sub-junctions are provided within a section of the surface region extending in one direction. Specifically, if N number of first Schottky junction 30 sub-junctions and N number of fourth region 24 sub-regions are considered as a single structural unit, the overall width thereof in the x direction is defined as effective width $L_E$, the width of the individual first Schottky junction 30 sub-junctions in the x direction is taken as $X_S/N$ and the width of the individual fourth region 24 sub-regions is taken as $x_C/N$, the aforesaid Eq. 2 will apply substantially as it is. In other words, the width $x_S$ of the first Schottky junction 30 in the x direction can be considered in this case to be the sum of the widths in the x direction of all of the N Schottky junction sub-junctions, while the width $x_C$ of the fourth region can be considered to be the sum of the widths in the x direction of all of the N fourth region sub-regions.

Thus, returning to Eq. 2, since this equation expresses $I_{sf}$ as a function of the width $x_S$ of the first Schottky junction 30 in the x direction, it should be possible to control the current value $I_{sf}$ and, as a consequence, the breakover current $I_{BO}$ and the hold current $I_H$ by selecting the proportion of the first Schottky junction 30 x-direction width or the effective width $L_E$ accounted for by the x-direction width $x_S$ of the first Schottky junction 30, i.e by selecting $$x_S/L_E(=x_S+x_C) \qquad 3)$$

or, otherwise, by selecting the proportion of the effective width $L_E$ accounted for by the x-direction width $x_C$ of the fourth region 24, i.e. by controlling $$x_C/L_E(=x_S+x_C) \quad 3')$$

Experiments conducted by the inventor based on this finding did in fact show that the breakover current $I_{BO}$ and the hold current $I_H$ could be controlled substantially linearly in accordance with the ratios relating to the x-direction width (hereinafter simply "width") $x_S$ of the first Schottky junction 30 and the width $x_C$ of the fourth semiconductor region 4 expressed by Eqs. 3 and 3'. To the contrary, however, the breakover current $I_{BO}$ and the hold current $I_H$ tended to exhibit saturation when the width $X_S$ of the first Schottky junction 30 was extended beyond a certain range.

Figure 6:
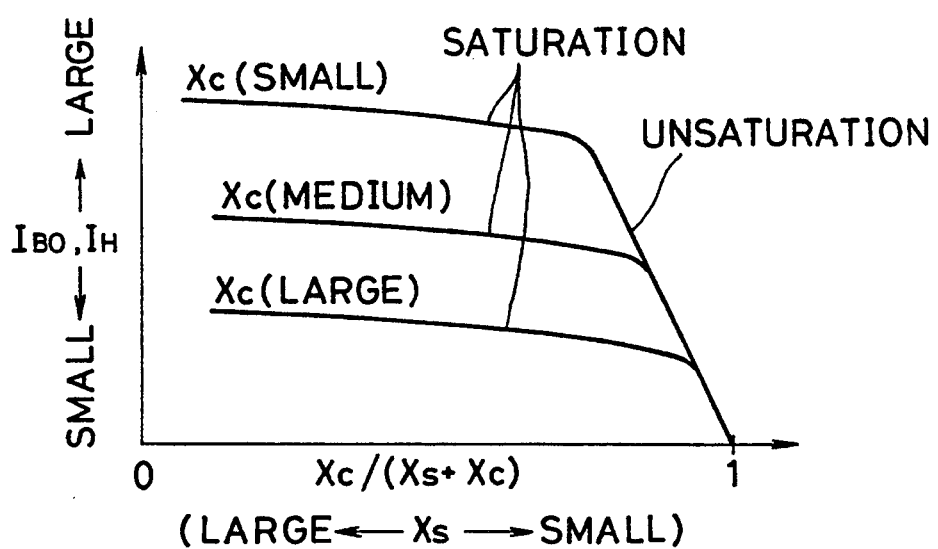
FIG. 6 is a graph showing in nondimensional terms the relationship between (a) the widths of the fourth region and the Schottky junction and (b) the breakover current and the hold current.

The tendencies generally common to all cases were derived from the results of a large number of tests and expressed as characteristics in FIG. 6, which shows that when the value of Eq. 3' is in a range near 1, i.e. when the width $x_C$ of the fourth region 24 accounts for a relatively large part of the effective width ($=x_X+x_C$) and the width $x_S$ of the first Schottky junction 30 is in a relatively small range, the breakover current $I_{BO}$ and the hold current $I_H$ finally obtained in the surge protection device according to the invention can, as indicated by "unsaturation" in the drawing, both be generally controlled in accordance with the aforesaid Eq. 2. However, as indicated by the "saturation" region on the left hand side of FIG. 6, after the part of the effective width $L_E$ accounted for by the width $x_X$ of the Schottky junction has reached a certain size, the breakover current $I_{BO}$ and the hold current $I_H$ of the device show a tendency to substantially saturate notwithstanding further increase of the width $x_S$ of the Schottky junction beyond a certain width range.

An investigation into the cause for this revealed that it can be understood from the following qualitative explanation.

Figure 5:
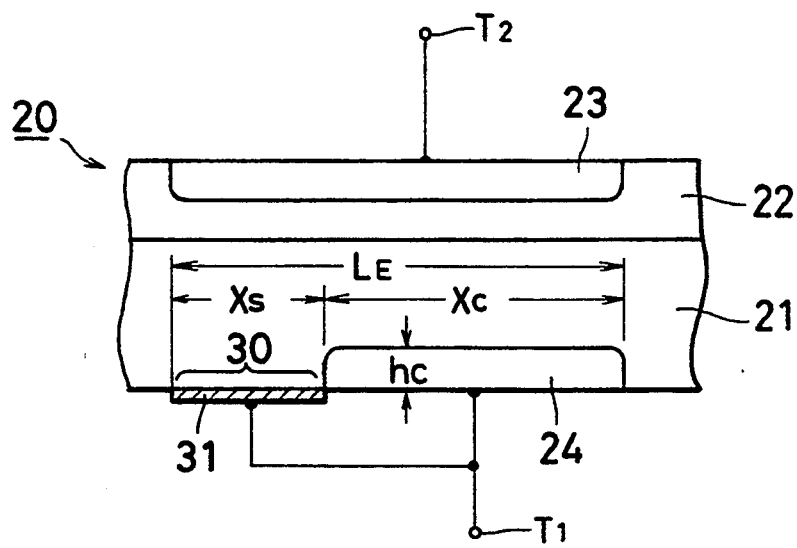
FIG. 5 is a sectional view for explaining the dimensional relationships among the device regions.
Figure 7:
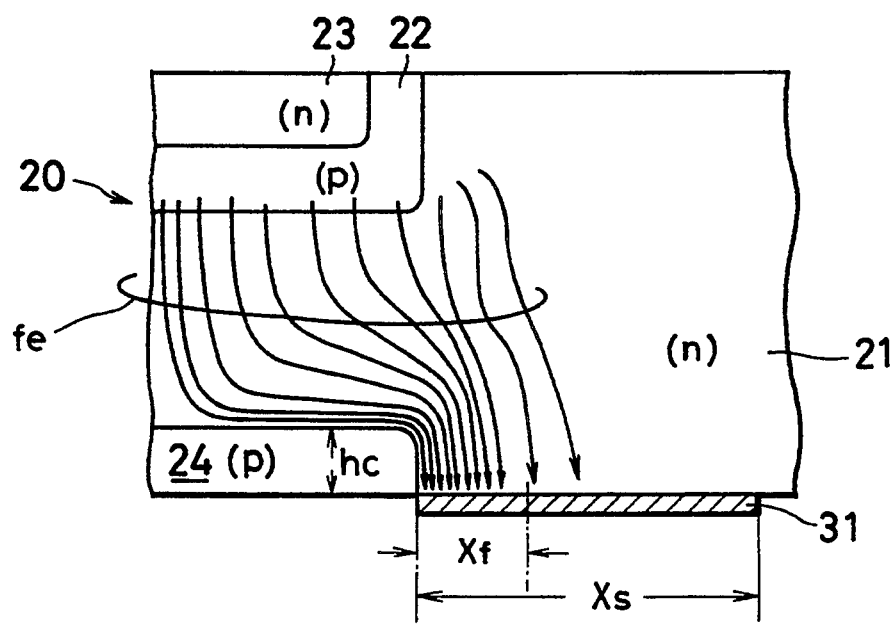
FIG. 7 is a diagram showing the pattern of current and electron flow relative to the Schottky junction in the case of a vertically fabricated surge protection device according to the invention.

Namely, as shown in FIG. 7, the current flowing through the first Schottky junction 30 (indicated in the drawing as reverse-direction electron flow $f_e$) flows as converged at a portion along the fourth region in the stage prior to forward biasing of the fourth region 24 (while the position of the first Schottky junction 30 in FIG. 5 is shown on the opposite side of the fourth region 24, this is for showing that the first Schottky junction 30 can be positioned on either side of the fourth region 24). As a result, if the actual width $x_S$ of the first Schottky junction 30 is small in relation to the width $x_f$ within which the current (electron flow $f_e$) is converged, changing the width $x_S$ within the range of the width $x_f$ will cause the aforesaid current value $I_{Sf}$ to change accordingly. As indicated by the unsaturated region in FIG. 6, this corresponds to the ability to control the breakover current $I_{BO}$ and the hold current $I_H$ by changing the width $x_S$ of the first Schottky junction 30 or the width $x_C$ of the fourth region.

It was further found that the maximum value $x_f$ of the width of the first Schottky junction 30 enabling securement of an unsaturated region can be expressed with relation to the thickness $h_C$ of the fourth region as $$x_f = \alpha h_C \quad 4)$$

where $\alpha$ is a number not larger than 1.

This means, therefore, that within the range of $$X_X < \alpha h_C \quad 4')$$

it is possible, by intentionally setting the width $x_S$ of the Schottky junction, to design in the breakover current $I_{BO}$ and the hold current $I_H$ of the surge protection device according to the invention. The invention thus increases design freedom by providing a new design parameter in addition to the region dimension parameters and the impurity concentration parameters of the prior art.

To the contrary, within the range $$x_S > x_f = \alpha h_C \quad 5)$$

the tendency indicated by FIG. 6 means that varying the width $x_S$ of the Schottky junction will not produce a very large change in the breakover current $I_{BO}$ and the hold current $I_H$ of the device. Thus, in cases where the actual circumstances at the production facility are such that the geometric production parameters of the Schottky junction portion are apt to fluctuate, it becomes possible to take advantage of this fact for preventing such production error from becoming a factor causing variation in the breakover current $I_{BO}$ and the hold current $I_H$ of the surge projection devices supplied to the market. This effect is of considerable significance.

While there may however be an upper limit on the width $x_S$ of the first Schottky junction 30 in this case, when a general estimate is made of the degree of lateral dispersion of the operating current flowing generally in the thickness direction of the first region 21, it preferable to keep the dispersion to within a width not larger than the distance separating the fourth region 24 and the first region 21 in the thickness direction, or at least within a width not larger than the thickness of the first region 21. Doing this makes it possible to achieve an environment of more uniformly mixed majority carriers and minority carries, whereby stable device operation can be anticipated and reduction of the surge absorption capacity can be avoided.

Further, in a case where a fourth region 24 is located on either side of the first Schottky junction 30 in the in-plane x-direction, Eq. 4' can be modified to $$X_X > 2\alpha h_C \quad 4'')$$

This will be easily understood from the fact that the width region of the Schottky junction in the direction which the first Schottky junction 30 and the pair of fourth regions both extend has at either side thereof a region exclusively for one of the fourth regions. In addition, the aforesaid observation applies even where the first Schottky junction 30 does not have an overall rectangular shape, insofar as it has a rectangular or nearly rectangular shape whose width extends in the direction in which both the first Schottky junction 30 and the fourth regions both extend.

On the other hand, FIG. 6 shows that even where the proportion of the effective width $L_E$ accounted for by the width of the fourth region 24 or by the width of the first Schottky junction 30 is the same, the breakover current $I_{BO}$ and the hold current $I_H$ will change if the absolute value of the width $x_C$ of the fourth region (and consequently the 10 effective width $L_E$) is changed. This is a fact which the inventor ascertained by calculation from extensive test results and can also be explained in qualitative terms.

Specifically, as schematically illustrated at the converged region in FIG. 7, the current which begins to flow through the first Schottky junction 30 follows closely along the periphery of the fourth region 24, which has not yet been forward biased. Therefore, the longer the path of this current flow, i.e. the greater the width $x_C$ of the fourth region 24, the greater will be the resistance value along the path of the current flowing through the first Schottky junction 30, notwithstanding that the resistivity of the first region 21 does not vary locally and the value of $\rho$ is constant. This means that the voltage drop $V_f$ required for forward biasing the pn junction including the fourth region can be obtained at a lower current value $I_{sf}$. Thus, as shown in FIG. 6, the larger the width $x_C$ of the fourth region 24, the earlier turn-on will occur, whereby the breakover current $I_{BO}$ and the hold current $I_H$ of the device will tend to decrease. Since this relationship is in accord with a controllable principle, it is possible to design in the device characteristics not only by selecting the width ratio between the fourth region 24 and the Schottky junction but also by selecting the absolute width of the fourth region 24. Moreover, the same results can be obtained simply by varying the length of the fourth region with respect to the Schottky junction, only in the direction in which they both extend (in the case at hand, by varying the width $x_C$ in the x direction as mentioned earlier).

It is stressed again that the shape of the fourth region 24 is not limited to rectangular. Generalizing, the area of the fourth region 24 can be defined as $S_C$, the perimeter as $R_C$, the area of the portion of the second region 22 at which avalanche breakdown occurs as $S_0$ in the case where avalanche breakdown is used for the initial breakdown phenomenon, the area of the third region 23 as $S_0$ in the case of punch-through where the sectional width of the third region is larger than the distance between the second region and the fourth region and the area of the second region 22 as $S_O$ in the case where it is smaller, in which case it holds that $$I_{sf} \approx (V_f - V_{sf}) \cdot S_0 / h_C \rho (1 + S_C / x_f R_C) \quad 6)$$

while the breakover current $I_{BO}$ can be expressed as $$I_{BO} = I_{sf} + I_{ff} \quad 7)$$

Since the second term $I_{ff}$ on the right side of Eq. 7 which is the minimum current required for forward biasing the third region 23 or the fifth region 25 is relatively small, especially so in a device using punch-through, the breakover current $I_{BO}$ is relatively determined by the dimensions contained in Eq. 6. Moreover, if the fourth region 24 is rectangular and its depth dimension W can be considered to be about one half of its perimeter $R_C$, Eq. 6 can be rewritten as $$I_{sf} \leq (V_f - V_{sf}) \cdot S_0 / h_C \rho (1 + x_C / 2x_f) \quad 6')$$

It is thus possible to control the breakover current $I_{BO}$ by selecting the short-side width $x_C$ of the fourth region 24.

If the fourth region 24 is circular, Eq. 6 becomes $$I_{sf} \approx (V_f - V_{sf}) \cdot S_0 / h_C \rho (1 + x_C / 4x_f) \quad 6'')$$

where the symbol $x_C$ previously used for the short-side width here represents the diameter. The breakover current $I_{BO}$ can thus be controlled in designing the device by selecting the diameter $x_C$ of the fourth region 24. Similarly, if the fourth region 24 is of regular polygonal shape, Eq. 6" can be applied by using the diameter of the circle whose area is equal to that of the regular polygon as $x_C$.

Figure 8:
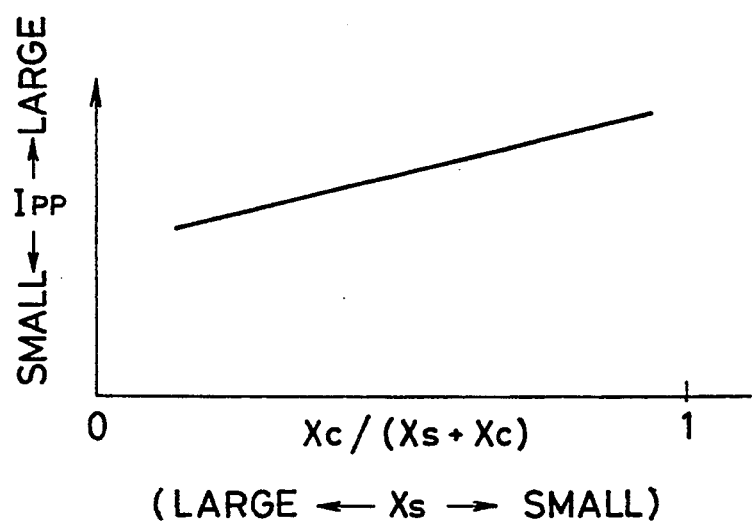
FIG. 8 is a graph showing in nondimensional terms the relationsip between (a) the widths or areas of the fourth region and the Schottky junction and (b) the surge absorption capacity.
Figure 9A:
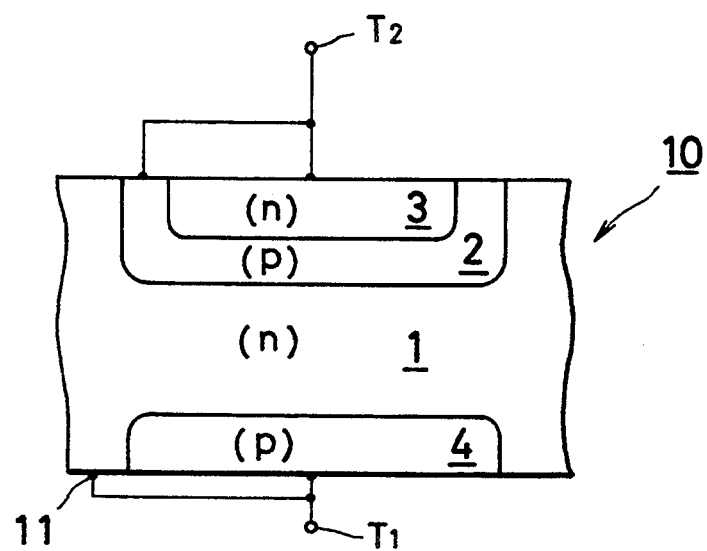
FIGS. 9(a) and (b) are diagrams illustrating the principle of the conventional surge protection device capable of absorbing surges of only one polarity.
Figure 9B:
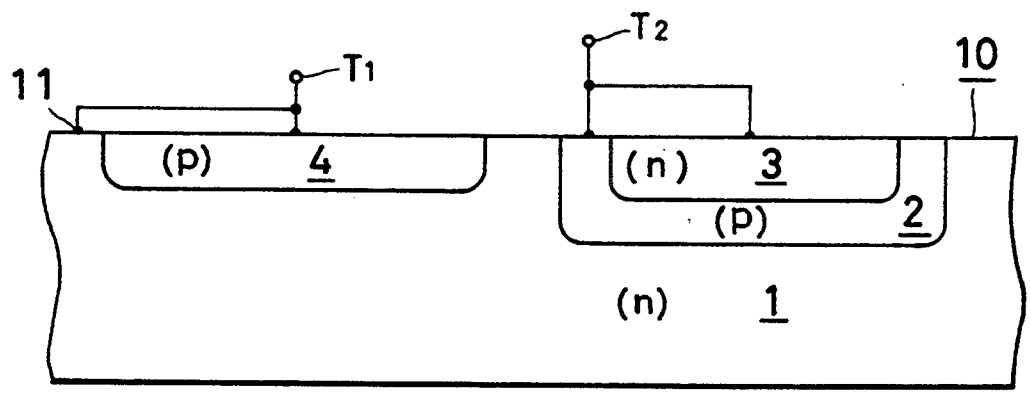

Tests conducted by the inventor further showed that, taking the case of a rectangular fourth region 24 as a typical example, increasing the proportion of the effective length $L_E$ accounted for by the width $x_C$ of the fourth region 24 causes the surge absorption capacity $I_{PP}$ to increase proportionally as shown in FIG. 8, with the result that its 10 value approaches that in the case of the conventional structure having only the fourth region 24 and no first Schottky junction 30. It was further found that a proportional relationship exists between the surge absorption capacity $I_{PP}$ and the proportion of the effective length $L_E$ accounted for by the width $x_C$, so that the surge absorption capacity $I_{PP}$ can be designed into the device by selecting this ratio. It is, however, the "area ratio" between the fourth region 24 and the first Schottky junction 30 that is directly related to the surge absorption capacity $I_{PP}$. Notwithstanding, where these are rectangular and have a fixed length in the y-direction perpendicular to the section illustrated in the drawings, the surge absorption capacity $I_{PP}$ can be determined by selecting the proportion of the effective length $L_E$ accounted for by the width $x_C$ of the fourth region 24, namely by selecting the size of the fourth region 24 in only one dimension.

It is of course also possible from a general viewpoint to give a quantitative explanation of why the surge absorption capacity $I_{PP}$ tends to increase as the proportion accounted for by the area of a fourth region 24 of given planar configuration increases. As is clear from the operating mechanism of the surge protection device 20 of the invention explained earlier, since the main path of the device current after breakover or turn-on owing to positive feedback is that between the third region 23 and the fourth region 24, the ability to absorb surge current increases with increasing area of the fourth region 24.

At any rate, the device structure according to the present invention provides a new degree of design freedom which can be fully employed in establishing or designing in the surge absorption capacity $I_{PP}$. Moreover, while the explanation with respect to FIGS. 5-8 was based on an example in which the third region 23 was a single continuous region, as was pointed out earlier the same also applies to the case where the third region 23 is formed of a plurality of sub-regions within a section of the surface region extending in one direction. In fact, for the reason explained in the foregoing, such an arrangement is preferable since by enabling uniform device current it makes it possible to obtain better and more stable characteristics.

In addition, while it is effective to form the second region 22 and the fourth region 24 as a plurality of rectangular sub-regions and to form a plurality of third region 23 sub-regions within the second region 22 and a plurality of fifth region 25 sub-regions within the fourth region 24, the plurality of rectangular second region 22 sub-regions and fourth region 24 sub-regions and the plurality of rectangular third region 23 sub-regions and fifth region 25 sub-regions can alternatively be provided to extend in mutually perpendicular directions. Such an arrangement also serves to make the current uniform.

It is also possible to integrate a plurality of the surge protection devices 20 according to the invention on a common first region 21, i.e. on substantially one and the same substrate 21. This makes it possible to provide an integrated surge protection device for a large number of circuits with package terminals as many as the number of the circuits or, by operating the plurality of devices in parallel, to provide a surge protection device able to absorb very large surge currents.

As has been explained in detail in the foregoing, the present invention provides a highly superior two-terminal, breakover type surge protection device capable of absorbing surges of either polarity and, in particular, to provide such a device which prevents undesirable responses in which breakover occurs upon exposure to noise having a small peak value but a very large rate of voltage change with respect 10 to time.

Moreover, certain of the embodiments of the invention enable control of the breakover current and the hold current or enable their values to be stabilized in close accordance with the design specifications. As such, the invention provides new design parameters for controlling and increasing the surge absorption capacity.

The present invention has thus been shown and described with reference to specific embodiments. However, it should be noted that the present invention is in no way limited to the details of the described arrangements but changes and modifications may be made without departing from the scope of the appended claims.

What is claimed is:

1. A two-terminal surge protection device for absorbing surges of either polarity, comprising:
    a first semiconductor region of a first conductivity type;
    a second semiconductor region of a second conductivity type opposite to said first conductivity type, forming a first pn junction with the first semiconductor region;
    a third semiconductor region of said first conductivity type, contacting s side of the second semiconductor region opposite from that in contact with the first semiconductor region, the third semiconductor region forming with the second semiconductor region a first minority carrier injection junction capable of injecting into the second semiconductor region carriers that are minority carriers to the second semiconductor region;
    a fourth semiconductor region of said second conductivity type, forming a second pn junction with the first semiconductor region;
    a fifth semiconductor region of said first conductivity type, contacting a side of the fourth semiconductor region opposite from that in contact with the first semiconductor region, the fifth semiconductor region forming with the fourth semiconductor region a second minority carrier injection junction capable of injecting into the fourth semiconductor region carriers that are minority carriers to the fourth semiconductor region;
    a first ohmic electrode in electrical contact with a surface of the fourth semiconductor region and with a surface of the fifth semiconductor region;
    a second ohmic electrode in electrical contact with a surface of the second semiconductor region and with a surface of the third semiconductor region;
    a first Schottky junction formed by contacting a first Schottky metal with the first semiconductor region and, when forward biased, operated by carriers that are majority carriers in the first semiconductor region to allow majority carrier current to flow through the first Schottky junction for charging a junction capacitance of the first pn junction the junction capacitance of the first pn junction being formed upon application of reverse bias to the first pn junction, the first Schottky metal being in electrical contact with the first ohmic electrode;
    a second Schottky junction formed by contacting a second Schottky metal with the first semiconductor region and, when forward biased, operated by carriers that are majority carriers in the first semiconductor region to allow majority carrier current to flow through the second Schottky junction for charging a junction capacitance of the second pn junction, the junction capacitance of the second pn junction being formed upon application of reverse bias to the second pn junction, the second Schottky metal being in electrical contact with the second ohmic electrode.

2. A Surge protection device according to claim 1, wherein contacting portions of the first and second ohmic electrodes make direct contact with the first semiconductor region, such contacting portions of the first and second ohmic electrodes directly corresponding to the first and second Schottky metals.

3. A surge protection device according to claim 1, wherein the first and second ohmic electrodes and the first and second Schottky metals are respectively formed of different materials, electrical connection between the fourth semiconductor region and the first Schottky metal being established by a portion of the first ohmic electrode, and electrical connection between the second semiconductor region and the second Schottky metal being established by a portion of the second ohmic electrode.

4. A surge protection device according to claim 1, wherein one edge portion of the first Schottky junction is in direct contact with one edge portion of the fourth semiconductor region.

5. A surge protection device according to claim 1, wherein one edge portion of the second Schottky junction is in direct contact with one edge portion of the second semiconductor region.

6. A surge protection device according to claim 1, wherein one edge portion of the first Schottky junction is in contact with a depletion layer formed by the junction between the fourth semiconductor region and the first semiconductor region, said depletion layer extending along a principal surface of the first semiconductor region.

7. A surge protection device according to claim 1, wherein one edge portion of the second Schottky junction is in contact with a depletion layer formed by the first pn junction between the second semiconductor region and the first region, said depletion layer extending along a principal surface of the first semiconductor region.

8. A surge protection device according to claim 1, wherein the fourth semiconductor region is formed of a plurality of mutually separate sub-regions disposed within a section perpendicular to a principal surface of the first semiconductor region and extending in one direction, the first Schottky junction is formed of a number of sub-junctions, said number is one less than the number of the fourth semiconductor region sub-regions within said section, each first Schottky junction sub-region is formed between an adjacent pair of the fourth semiconductor region sub-regions and has a pair of opposite edge portions within said section, each adjacent pair of the fourth semiconductor region sub-regions has opposing edge portions within said section, and said opposite edge portions of each first Schottky junction sub-junction are in direct contact with said opposing edge portions of the fourth semiconductor region sub-regions between which said each first Schottky junction sub-junction is disposed.

9. A surge protection device according to claim 1, wherein the second semiconductor region is formed of a plurality of mutually separate sub-regions disposed within a section perpendicular to a principal surface of the first semiconductor region and extending in one direction, the second Schottky junction is formed of a number of sub-junctions, said number is one less than the number of the second semiconductor region sub-regions within said section, each second Schottky junction sub-region is formed between an adjacent pair of the second semiconductor region sub-regions and has a pair of opposite edge portions within said section, each adjacent pair of the second semiconductor region sub-regions has opposing edge portions within said section, and said opposite edge portions of each second Schottky junction sub-junction are in direct contact with said opposing edge portions of the second semiconductor region sub-regions between which said each second Schottky junction sub-junction is disposed.

10. A surge protection device according to claim 1, wherein the fourth semiconductor region is formed of a plurality of mutually separate sub-regions disposed within a section perpendicular to a principal surface of the first semiconductor region and extending in one direction, the first Schottky junction is formed of a number of sub-junctions, said number is one less than the number of the fourth semiconductor region sub-regions within said section, each first Schottky junction sub-region is formed between an adjacent pair of the fourth semiconductor region sub-regions and has a pair of opposite edge portions within said section, each adjacent pair of the fourth semiconductor region sub-regions has opposing edge portions within said section, and said opposite edge portions of each first Schottky junction sub-junction are in contact with a depletion layer formed by the junction between the fourth semiconductor region sub-regions and the first semiconductor region, said depletion layer extending along the principal surface of the first semiconductor region.

11. A surge protection device according to claim 1, wherein the second semiconductor region is formed of a plurality of mutually separate sub-regions disposed within a section perpendicular to a principal surface of the first semiconductor region and extending in one direction, the second Schottky junction is formed of a number of sub-junctions, said number is one less than the number of the second semiconductor region sub-regions within said section, each second Schottky junction sub-region is formed between an adjacent pair of the second semiconductor region sub-regions and has a pair of opposite edge portions within said section, each adjacent pair of the second semiconductor region sub-regions has opposing edge portions within said section, and said opposite edge portions of each second Schottky junction sub-junction are in contact with a depletion layer formed by the junction between the second semiconductor region sub-regions and the first semiconductor region, said depletion layer extending along the principal surface of the first semiconductor region.

12. A surge protection device according to claim 1, wherein the first Schottky junction is circumferentially enclosed by the fourth semiconductor region at a principal surface of the first semiconductor region and has a pair of opposite edge portions within a section perpendicular to the principal surface of the first semiconductor region, the fourth semiconductor region has opposing edge portions within said section, and said opposite edge portions of the first Schottky junction are in direct contact with said opposing edge portions of the fourth semiconductor region, respectively.

13. A surge protection device according to claim 1, wherein the second Schottky junction is circumferentially enclosed by the second semiconductor region at a principal surface of the first semiconductor region and has a pair of opposite edge portions within a section perpendicular to the principal surface of the first semiconductor region, the second semiconductor region has opposing edge portions within said section, and said opposite edge portions of the second Schottky junction are in direct contact with said opposing edge portions of the second semiconductor region, respectively.

14. A surge protection device according to claim 1, wherein the first Schottky junction is circumferentially enclosed by the fourth semiconductor region at a principal surface of the first semiconductor region and has a pair of opposite edge portions within a section perpendicular to the principal surface of the first semiconductor region, the fourth semiconductor region has opposing edge portions within said section, and said opposite edge portions of the first Schottky junction are in contact with a depletion layer formed by the second pn junction between the fourth semiconductor region and the first semiconductor region, said depletion layer extending along the principal surface of the first semiconductor region.

15. A surge protection device according to claim 1, wherein the second Schottky junction is circumferentially enclosed by the second semiconductor region at a principal surface of the first semiconductor region and has a pair of opposite edge portions within a section perpendicular to the principal surface of the first semiconductor region, the second semiconductor region has opposing edge portions within said section, and said opposite edge portions of the second Schottky junction are in contact with a depletion layer formed by the first pn junction between the second semiconductor region and the first semiconductor region, said depletion layer extending along the principal surface of the first semiconductor region.

16. A surge protection device according to claim 1, wherein the first semiconductor region has a front principal surface and a back principal surface opposed to said front principal surface and has a thickness between said front principal surface and said back principal surface.

17. A surge protection device according to claim 16, wherein the fourth semiconductor region and the first Schottky junction oppose the second semiconductor region and the second Schottky junction in a direction along the thickness between the front principal surface and the back principal surface, and a ratio between area of the fourth semiconductor region and area of the first Schottky junction and a ratio between area of the second semiconductor and area of the second Schottky junction define surge absorption capacities with respect to surges of respective polarities.

18. A surge protection device according to claim 16, wherein the fourth semiconductor region and the first Schottky junction oppose the second semiconductor region and the second Schottky junction in a direction along the thickness between the front principal surface and the back principal surface, and a length of the fourth semiconductor region in a direction in which the fourth semiconductor region and the first Schottky junction are arranged side-by-side and a length of the second semiconductor region In a direction in which the second semiconductor region and the second Schottky junction are arranged side-by-side define a breakover current with respect to surges of respective polarities.

19. A surge protection device according to claim 16, wherein the fourth semiconductor region and the first Schottky junction oppose the second semiconductor region and the second Schottky junction in a direction along the thickness between the front principal surface and the back principal surface, and a length of the fourth semiconductor region in a direction in which the fourth semiconductor region and the first Schottky junction are arranged side-by-side and a length of the second semiconductor region in a direction in which the second semiconductor region and the second Schottky junction are arranged side-by-side define a hold current with respect to surges of respective polarities.

20. A surge protection device according to claim 16, wherein the fourth semiconductor region and the first Schottky junction oppose the second semiconductor region and the second Schottky junction in a direction along the thickness between the front principal surface and the back principal surface, the first Schottky junction has a first substantially rectangular shape having a first width extending in a first direction in which the fourth semiconductor region and the first Schottky junction are arranged side-by-side, the first width is not greater than a width which causes the majority carrier current to flow convergently through the first Schottky junction into the first semiconductor region, the second Schottky junction has a second substantially rectangular shape having a second width extending in a second direction in which the second semiconductor region and the second Schottky junction are arranged side-by-side, and the second width is not greater than a width which causes the majority carrier current to flow convergently through the second Schottky junction into the first semiconductor region.

21. A surge protection device according to claim 16, wherein the fourth semiconductor region is formed of at least a pair of mutually separated fourth semiconductor region sub-regions disposed within a section perpendicular to the back principal surface and extending in a first direction parallel to the back principal surface, the second semiconductor region is formed of at least a pair of mutually separated second semiconductor region sub-regions disposed within a section perpendicular to the front principal surface and extending in a second direction parallel to the front principal surface, the fourth semiconductor region sub-regions and the first Schottky junction oppose the second semiconductor sub-regions and the second Schottky junction in a direction along the thickness between the front principal surface and the back principal surface, the first Schottky junction is disposed between the pair of the fourth semiconductor region sub-regions and has a first substantially rectangular shape having a first width between a pair of opposite edge portions of the first substantially rectangular shape in the first direction, one of the pair of the opposite edge portions in the first direction is in contact with a side of one of the pair of the fourth semiconductor region sub-regions, the other of the pair of opposite edge portions in the first direction is in contact with a side of the other of the pair of the fourth semiconductor region sub-regions, the first width is not greater than twice a width which causes the majority carrier current to flow convergently through the first Schottky junction into the first semiconductor region, the second Schottky junction is disposed between the pair of the second semiconductor region sub-regions and has a second substantially rectangular shape having a second width between a pair of opposite edge portions of the second rectangular shape in the second direction, one of the pair of the opposite edge portions in the second direction is in contact with a side of one of the pair of the second semiconductor region sub-regions, the other of the pair of the opposite edge portions in the second direction is in contact with a side of the other of the pair of the second semiconductor region sub-regions, and the second width is not greater than twice a width which causes the majority carrier current to flow convergently through the second Schottky junction into the first semiconductor region.

22. A surge protection device according to claim 16, wherein the fourth semiconductor region is formed of at least a pair of mutually separated fourth semiconductor region sub-regions disposed within a section perpendicular to the back principal surface and extending in a first direction parallel to the back principal surface, the second semiconductor region is formed of at least a pair of mutually separated second semiconductor region sub-regions disposed within a section perpendicular to the front principal surface and extending in a second direction parallel to the front principal surface, the fourth semiconductor region sub-regions and the first Schottky junction oppose the second semiconductor sub-regions and the second Schottky junction in a direction along the thickness between the front principal surface and the back principal surface, the first Schottky junction is disposed between the pair of the fourth semiconductor region sub-regions and has a first substantially rectangular shape having a first width between a pair of opposite edge portions of the first substantially rectangular shape in the first direction, one of the pair of the opposite edge portions in the first direction is in contact with a first depletion layer extending along the back principal surface and formed by a junction between one of the pair of the fourth semiconductor region sub-regions and the first semiconductor region, the other of the pair of the opposite edge portions in the first direction is in contact with a second depletion layer extending along the back principal surface and formed by a junction between the other of the pair of the fourth semiconductor region sub-regions and the first semiconductor region, the first width is not greater than twice a width which causes the majority carrier current to flow convergently through the first Schottky junction into the first semiconductor region, the second Schottky junction is disposed between the pair of the second semiconductor region sub-regions and has a second substantially rectangular shape having a second width between a pair of opposite edge portions of the second rectangular shape in the second direction, one of the pair of the opposite edge portions in the second direction is in contact with a third depletion layer extending along the front principal surface and formed by a junction between one of the pair of the second semiconductor region sub-regions and the first semiconductor region, the other of the pair of the opposite edge portions in the second direction is in contact with a fourth depletion layer extending along the front principal surface and formed by a junction between the other of the pair of the second semiconductor region sub-regions and the first semiconductor region, and the second width is not greater than twice a width which causes the majority carrier current to flow convergently through the second Schottky junction into the first semiconductor region.

23. A surge protection device according to claim 16, wherein the fourth semiconductor region and the first Schottky junction oppose the second semiconductor region and the second Schottky junction in a direction along the thickness between the front principal surface and the back principal surface, the first Schottky junction has a first substantially rectangular shape having a first width extending in a first direction in which the fourth semiconductor region and the first Schottky junction are arranged side-by-side, the first width is greater than a width which causes the majority carrier current to flow convergently through the first Schottky junction into the first semiconductor region, the second Schottky junction has a second substantially rectangular shape having a second width extending in a second direction in which the second semiconductor region and the second Schottky junction are arranged side-by-side, and the second width is greater than a width which causes the majority carrier current to flow convergently through the second Schottky junction into the first semiconductor region.

24. A surge protection device according to claim 23, wherein each of the first width and the second width is not larger than a distance between the fourth semiconductor region and the second semiconductor region.

25. A surge protection device according to claim 23, wherein each of the first width and the second width is not larger than the thickness between the front principal surface and the back principal surface.

* * * * *